US012681059B2

(12) United States Patent
Wu

(10) Patent No.: US 12,681,059 B2
(45) Date of Patent: Jul. 14, 2026

(54) WIND TURBINE, CONVERTER, AND LOW-VOLTAGE RIDE-THROUGH DETECTION METHOD AND DEVICE

(71) Applicant: XINJIANG GOLDWIND SCIENCE & TECHNOLOGY CO., LTD., Urumqi (CN)

(72) Inventor: Lei Wu, Beijing (CN)

(73) Assignee: GOLDWIND SCIENCE & TECHNOLOGY CO., LTD., Urumqi (CN)

( * ) Notice: Subject to any disclaimer, the term of this patent is extended or adjusted under 35 U.S.C. 154(b) by 430 days.

(21) Appl. No.: 18/257,772

(22) PCT Filed: Sep. 27, 2021

(86) PCT No.: PCT/CN2021/120987
§ 371 (c)(1),
(2) Date: Jun. 15, 2023

(87) PCT Pub. No.: WO2022/127270
PCT Pub. Date: Jun. 23, 2022

(65) Prior Publication Data
US 2024/0118324 A1      Apr. 11, 2024

(30) Foreign Application Priority Data

Dec. 15, 2020      (CN) .......................... 202011479355.5

(51) Int. Cl.
*G01R 19/25*          (2006.01)
*H02J 3/12*            (2026.01)
(Continued)

(52) U.S. Cl.
CPC ............ *G01R 19/2513* (2013.01); *H02J 3/12* (2013.01); *H02J 3/38* (2013.01); *H02J 2101/28* (2026.01)

(58) Field of Classification Search
CPC .. G01R 19/2513; G01R 31/086; G01R 31/00; G01R 31/343; H02J 3/12; H02J 3/38; H02J 2300/28; H02J 3/381
See application file for complete search history.

(56) References Cited

U.S. PATENT DOCUMENTS

| | | | |
|---|---|---|---|
| 2011/0089693 A1 | 4/2011 | Nasiri | |
| 2012/0150524 A1* | 6/2012 | Nielsen | H02J 3/381 |
| | | | 290/44 |

(Continued)

FOREIGN PATENT DOCUMENTS

| | | | |
|---|---|---|---|
| CN | 101968032 A | | 2/2011 |
| CN | 102121966 A | * | 7/2011 |

(Continued)

OTHER PUBLICATIONS

Australian Examination Report No. 1 dated Jun. 4, 2024; Appln. No. 2021404446.

(Continued)

*Primary Examiner* — Yossef Korang-Beheshti
(74) *Attorney, Agent, or Firm* — Frank Gao, Esq.

(57)          ABSTRACT

The present disclosure provides a wind turbine, a converter, and a low-voltage ride-through detection method and device. The low-voltage ride-through detection method includes: determining an adjustment value of a preset parameter of a power grid on the basis of a power grid voltage, wherein the preset parameter includes at least one of a current, a current frequency and a power factor angle; adjusting the preset parameter of the power grid on the basis of the adjustment value; and detecting, on the basis of a power grid voltage after the preset parameter of the power grid is adjusted, whether the power grid meets a low-voltage ride-through condition. Therefore, a power grid fault of the wind turbine in a weak grid can be accurately identified, so as to enter a low-voltage ride-through state, thereby avoid- (Continued)

Determining an adjustment value of a preset parameter of a power grid on the basis of a power grid voltage ⟶ S101

Adjusting the preset parameter of the power grid on the basis of the adjustment value ⟶ S102

Detecting, on the basis of a power grid voltage after the preset parameter is adjusted, whether the power grid meets a low-voltage ride-through condition ⟶ S103 ing system instability in the process of a power grid fault ride-through in the weak grid.

14 Claims, 2 Drawing Sheets

(51) Int. Cl.
*H02J 3/38* (2026.01)
*H02J 101/28* (2026.01)

(56) References Cited

U.S. PATENT DOCUMENTS

| | | | |
|---|---|---|---|
| 2013/0265809 A1 | 10/2013 | Gupta et al. | |
| 2014/0138949 A1 | 5/2014 | El Moursi et al. | |
| 2017/0314534 A1 | 11/2017 | Gupta et al. | |
| 2021/0175829 A1* | 6/2021 | Jiang | H02P 21/18 |

FOREIGN PATENT DOCUMENTS

| | | | | | |
|---|---|---|---|---|---|
| CN | 102468652 | A | * | 5/2012 | |
| CN | 102508162 | A | | 6/2012 | |
| CN | 104795842 | A | | 7/2015 | |
| CN | 105281366 | A | | 1/2016 | |
| CN | 106291356 | A | | 1/2017 | |
| CN | 106953355 | A | | 7/2017 | |
| CN | 107196335 | A | * | 9/2017 | H02J 3/12 |
| CN | 109167382 | A | * | 1/2019 | H02P 9/007 |
| CN | 109672210 | A | | 4/2019 | |
| CN | 106953355 | B | | 12/2019 | |
| CN | 110535169 | A | * | 12/2019 | H02J 3/0014 |
| CN | 110581565 | A | | 12/2019 | |
| CN | 111327075 | A | | 6/2020 | |
| CN | 111416393 | A | | 7/2020 | |
| CN | 113325246 | A | | 8/2021 | |
| EP | 2859638 | B1 | | 5/2020 | |
| WO | 2017/025022 | A1 | | 2/2017 | |

OTHER PUBLICATIONS

The Extended European Search Report dated Jul. 30, 2024; Appln. No. 21905200.8.

The International Search Report mailed Jan. 5, 2022; PCT/CN2021/120987.

Tianyi Chen, et al; "LVRT Control Method of Virtual Synchronous Generator Based on Mode Smooth Switching", Power System Technology, vol. 40, No. 7, Jul. 2016; 7 pages.

Weizu Chen, et al; "Review of research on medium and low voltage ride-through technology for photovoltaic grid-connected" Technological Frontier.

Sen Ouyang, et al; "Low voltage ride through control strategy of photovoltaic inverter considering voltage fault type", Electric Power Automation Equipment; vol. 38, No. 9, Sep. 2018; 6 pages. *English Abstract at End of Paper*.

Guo-Quan Wang, et al; "The Research on Low Voltage Crossing Control Strategy for Doubly-fed Wind Power Generation System", Telecom Power Technology; vol. 34, No. 1, Jan. 25, 2017; 2 pages.

Qin-xiong Lu, et al. "Control strategy for low voltage ride-though of direct-drive permanent magnet wind power generator", Funding Project: Shanxi Provice Outstanding Graduate Innovation Project (May 31, 2012) 5 pages.

CN Notice of the Granting of a Patent Right for an Invention; Date of Issuance: Apr. 22, 2026; Appln. No. 202011479355.5.

* cited by examiner

WIND TURBINE, CONVERTER, AND LOW-VOLTAGE RIDE-THROUGH DETECTION METHOD AND DEVICE

CROSS-REFERENCE TO RELATED APPLICATIONS

This application is a National Stage of International Application No. PCT/CN2021/120987, filed 27 Sep. 2021, which claims priority to and the benefit of Chinese Application No. 202011479355.5, filed 15 Dec. 2020, the entireties of which are hereby incorporated herein by reference.

TECHNICAL FIELD

The present disclosure relates to the field of wind power generation technologies. More particularly, the present disclosure relates to a wind turbine, a converter, and a low-voltage ride-through detection method and device.

BACKGROUND

When a wind turbine is connected to a weak grid, a voltage drop formed by a grid-connected current of the wind turbine and a line impedance function has a significant effect on an end voltage of the wind turbine. When a far end of the power grid fails, there is a phenomenon that the end voltage of the wind turbine does not drop and the system oscillates.

SUMMARY

An exemplary embodiment of the present disclosure is to provide a wind turbine, a converter, and a low-voltage ride-through detection method and device.

According to an exemplary embodiment of the present disclosure, there is provided a low-voltage ride-through detection method, including: determining an adjustment value of a preset parameter of a power grid on the basis of a power grid voltage, wherein the preset parameter includes at least one of a current, a current frequency and a power factor angle; adjusting the preset parameter of the power grid on the basis of the adjustment value; and detecting, on the basis of a power grid voltage after the preset parameter of the power grid is adjusted, whether the power grid meets a low-voltage ride-through condition.

According to an exemplary embodiment of the present disclosure, there is provided a low-voltage ride-through detection device, including: an adjustment value determination unit configured to determine an adjustment value of a preset parameter of a power grid on the basis of a power grid voltage, wherein the preset parameter includes at least one of a current, a current frequency and a power factor angle; a parameter adjustment unit configured to adjust the preset parameter of the power grid on the basis of the adjustment value; and a low-voltage ride-through detection unit configured to detect, on the basis of a power grid voltage after the preset parameter of the power grid is adjusted, whether the power grid meets a low-voltage ride-through condition.

According to an exemplary embodiment of the present disclosure, there is provided a converter, including the low-voltage ride-through detection device according to the exemplary embodiment of the present disclosure.

According to an exemplary embodiment of the present disclosure, there is provided a wind power generator set, including the converter according to the exemplary embodiment of the present disclosure.

According to an exemplary embodiment of the present disclosure, there is provided a computer-readable storage medium having stored thereon computer programs that, when executed by a processor, implement the low-voltage ride-through detection method according to the exemplary embodiment of the present disclosure.

According to an exemplary embodiment of the present disclosure, there is provided a computing device, including: at least one processor; at least one memory storing computer programs that, when executed by the at least one processor, implement the low-voltage ride-through detection method according to the exemplary embodiment of the present disclosure.

According to an exemplary embodiment of the present disclosure, there is provided a computer program product, wherein instructions in the computer program product are executable by a processor of a computer device to achieve the low-voltage ride-through detection method according to the exemplary embodiment of the present disclosure.

Further aspects and/or advantages of the disclosed general concept will be set forth in part in the following description and, in part, will be obvious from the description, or may be learned by practice of the disclosed general concept.

BRIEF DESCRIPTION OF THE DRAWINGS

The above and other purposes and features of exemplary embodiments of the present disclosure will become more apparent by the following detailed description in conjunction with the accompanying drawings showing embodiments by way of example, wherein.

DETAILED DESCRIPTION

Figure 1:
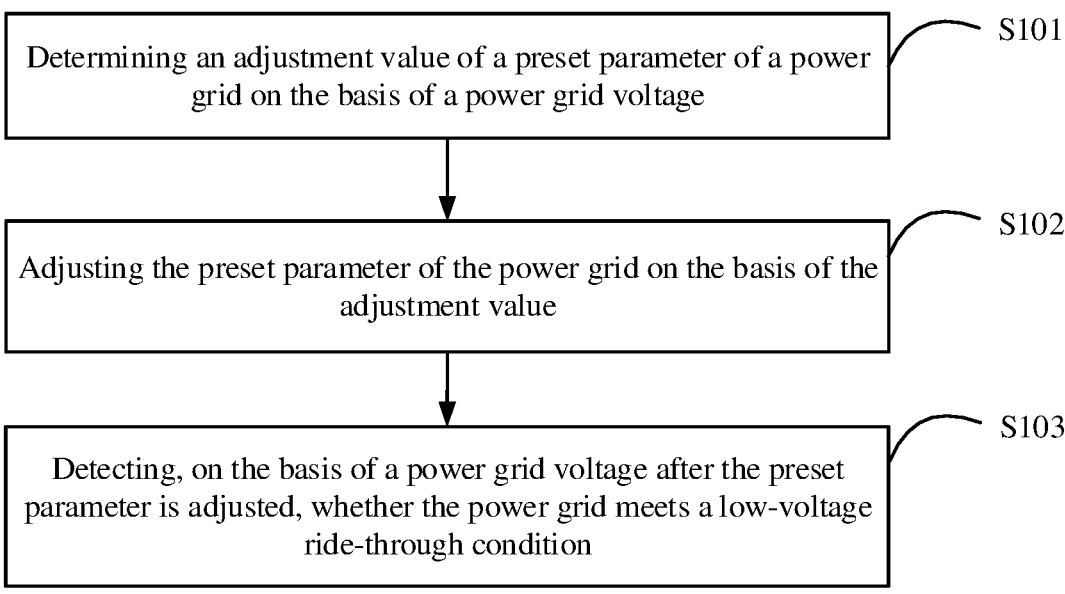
FIG. 1 shows a flow diagram of a low-voltage ride-through detection method according to an exemplary embodiment of the present disclosure.

Reference will now be made in detail to the exemplary embodiments of the present disclosure, examples of the embodiments are illustrated in the accompanying drawings, wherein like reference numerals refer to the like components throughout. The embodiments will be described below by referring to the accompanying drawings in order to explain the present disclosure.

An end voltage $\vec{E}_{WT}$ of a wind turbine can be constrained by a node voltage $\vec{E}_g$ and a line impedance voltage drop $\vec{E}_z$ of a power grid. For example, $$\vec{E}_{WT} = \vec{E}_g + \vec{E}_z.$$

The line impedance voltage drop $\vec{E}_z$ is related to a line impedance Z, an output current amplitude $\vec{I}$ of the wind turbine, a current frequency f, a power factor angle, etc. For example, $$\vec{E}_x = 2 \times \pi \times f \times Z \times \vec{I}.$$

Thus, even if the node voltage of the power grid has dropped, the line impedance voltage drop may also cause an end voltage of the wind turbine not to fall below a low-voltage ride-through threshold, thereby causing the wind turbine not to operate in a low-voltage ride-through state.

The present disclosure proposes to use a scheme of injecting a disturbance into the power grid to reduce the impedance voltage drop, thereby realizing a low-voltage ride-through detection of the wind turbine.

FIG. 1 shows a flow diagram of a low-voltage ride-through detection method according to an exemplary embodiment of the present disclosure.

Referring to FIG. 1, at step S101, an adjustment value of a preset parameter of a power grid is determined on the basis of a power grid voltage.

In an exemplary embodiment of the present disclosure, the preset parameter may include at least one of a current, a current frequency and a power factor angle. That is, if the preset parameter is at least one of a current, a current frequency and a power factor angle, an adjustment value of the at least one thereof may be determined on the basis of the power grid voltage, for example, if the preset parameter is a current, an adjustment value of the current of the power grid may be determined on the basis of the power grid voltage; if the preset parameter is a current frequency, an adjustment value of the current frequency of the power grid may be determined on the basis of the power grid voltage; if the preset parameter is a power factor angle, an adjustment value of the power factor angle of the power grid may be determined on the basis of the power grid voltage; if the preset parameters are a current and a power factor angle, an adjustment value of the current and an adjustment value of the power factor angle of the power grid may be determined on the basis of the power grid voltage; if the preset parameters are a current and a current frequency, an adjustment value of the current and an adjustment value of the current frequency of the power grid may be determined on the basis of the power grid voltage; if the preset parameters are a current, a current frequency and a power factor angle, an adjustment value of the current, an adjustment value of the current frequency and an adjustment value of the power factor angle of the power grid may be determined on the basis of the grid voltage.

In an exemplary embodiment of the present disclosure, when determining an adjustment value of a preset parameter of a power grid on the basis of a power grid voltage, a Q-axis component of the power grid voltage may be acquired firstly and then an active current limiting amplitude output by a wind turbine may be calculated on the basis of the Q-axis component of the power grid voltage.

In an exemplary embodiment of the present disclosure, when acquiring the Q-axis component of the power grid voltage, the Q-axis component of the power grid voltage may be calculated by a converter phase-locked loop of the power grid. In particular, the Q-axis component of the power grid voltage calculated by the converter phase-locked loop may be used as a trigger factor of a disturbing current.

In an exemplary embodiment of the present disclosure, when calculating the active current limiting amplitude output by the wind turbine on the basis of the Q-axis component of the power grid voltage, a filtering process may be performed on the Q-axis component of the power grid voltage firstly, and then the active current limiting amplitude output by the wind turbine may be calculated according to the processed Q-axis component, thereby improving stability of the power grid. Preferably, in order to perform low-voltage ride-through detection quickly, when performing a filtering process on the Q-axis component of the power grid voltage, a filter delay should not exceed $\frac{1}{4}$ of a work frequency period.

In an exemplary embodiment of the present disclosure, when determining the adjustment value of the preset parameter of the power grid on the basis of the power grid voltage, the Q-axis component of the power grid voltage may firstly be calculated by the converter phase-locked loop, a filtering process may be performed on the Q-axis component of the power grid voltage, and then the active current limiting amplitude output by the wind turbine may be calculated according to the processed Q-axis component.

In an exemplary embodiment of the present disclosure, when calculating the active current limiting amplitude output by the wind turbine according to the processed Q-axis component, an apparent current output by the wind turbine may firstly be calculated on the basis of the processed Q-axis component and a rated grid-connected apparent current of a wind turbine, and then the active current limiting amplitude output by the wind turbine may be calculated on the basis of the apparent current output by the wind turbine. For example, the active current limiting amplitude output by the wind turbine may be calculated according to the formula $$I_s = (1 - K * E_q) * I_{s\_rated}$$

$$I_{d\_Max} = \sqrt{I_s^2 - I_{q\_ref}^2}.$$

Herein, $I_s$ is the apparent current at an inverter side of a converter, $E_q$ is the Q-axis component of the power grid voltage calculated by the converter phase-locked loop, $I_{s\_rated}$ is the rated grid-connected apparent current of the set, $I_{q\_ref}$ is a reactive current reference value of the set, $I_{d\_max}$ is the active current limiting amplitude, and K is an intensity adjustment gain.

In an exemplary embodiment of the present disclosure, a filtering process may also be performed on the calculated active current limiting amplitude $I_{d\_max}$. Variable rate filtering may be performed when performing a filtering process on the calculated active current limiting amplitude $I_{d\_max}$. For example, the variable rate filtering may be applied to the calculated active limiting amplitude $I_{d\_max}$. No filtering is performed when $I_{d\_max}$ decreases and low-pass filtering is performed when $I_{d\_max}$ increases.

At step S102, the preset parameter of the power grid is adjusted on the basis of the determined adjustment value.

In particular, if the preset parameter is at least one of a current, a current frequency and a power factor angle, the at least one thereof may be adjusted on the basis of the determined adjustment value of the at least one thereof, for example, if the preset parameter is a current, a current of the power grid may be adjusted on the basis of the determined adjustment value of the current; if the preset parameter is a current frequency, a current frequency of the power grid may be adjusted on the basis of the determined adjustment value of the current frequency; if the preset parameter is a power factor angle, an power factor angle of the power grid may be adjusted on the basis of the determined adjustment value of the power factor angle; if the preset parameters are a current and a power factor angle, a current and an power factor angle of the power grid may be adjusted on the basis of the determined adjustment value of the current and the determined adjustment value of the power factor angle, respectively; if the preset parameters are a current and a current frequency, a current and a current frequency of the power grid may be adjusted on the basis of the determined adjustment value of the current and the determined adjustment value of the current frequency, respectively; if the preset parameters are a current, a current frequency and a power factor angle, a current, a current frequency and a power factor angle of the power grid may be adjusted on the basis of the determined adjustment value of the current, the determined adjustment value of the current frequency and the determined adjustment value of the power factor angle, respectively.

At step S103, it is detected that, on the basis of a power grid voltage after the preset parameter of the power grid is adjusted, whether the power grid meets a low-voltage ride-through condition.

In an exemplary embodiment of the present disclosure, when detecting, on the basis of a power grid voltage after the preset parameter of the power grid is adjusted, whether the power grid meets a low-voltage ride-through condition, a D-axis component and a Q-axis component of the power grid voltage after the preset parameter of the power grid is adjusted may firstly be acquired, a vector sum of the D-axis component and the Q-axis component of the power grid voltage after the preset parameter is adjusted may be calculated to obtain a positive sequence voltage amplitude of the power grid voltage after the preset parameter is adjusted, and a low-pass filtering process may be performed on the positive sequence voltage amplitude, and then it may be detected that, on the basis of the processed positive sequence voltage amplitude and a preset low-voltage ride-through threshold, whether the power grid meets a low-voltage ride-through condition. For example, a positive sequence component of a three-phase voltage may firstly be extracted using a symmetrical component method, and then Clark and Park transformations are performed on the positive sequence component of the three-phase voltage to obtain the D-axis component and the Q-axis component of the power grid voltage.

In an exemplary embodiment of the present disclosure, when detecting, on the basis of the processed positive sequence voltage amplitude and a preset low-voltage ride-through threshold, whether the power grid meets a low-voltage ride-through condition, a difference between the preset low-voltage ride-through threshold and the processed positive sequence voltage amplitude may firstly be calculated, the difference between the preset low-voltage ride-through threshold and the processed positive sequence voltage amplitude may be input to a hysteresis controller, and then under a condition that the difference between the preset low-voltage ride-through threshold and the processed positive sequence voltage amplitude is greater than an entering hysteresis value of the hysteresis controller, a delay counter starts to count, and it is determined that the power grid meets the low-voltage ride-through condition under a condition that the count value of the delay counter reaches a target delay; under a condition that the difference between the preset low-voltage ride-through threshold and the processed positive sequence voltage amplitude is less than an exit hysteresis value of the hysteresis controller, the delay counter starts to count, and it is determined that the power grid does not meet the low-voltage ride-through condition under a condition that the count value of the delay counter reaches the target delay.

Figure 2:
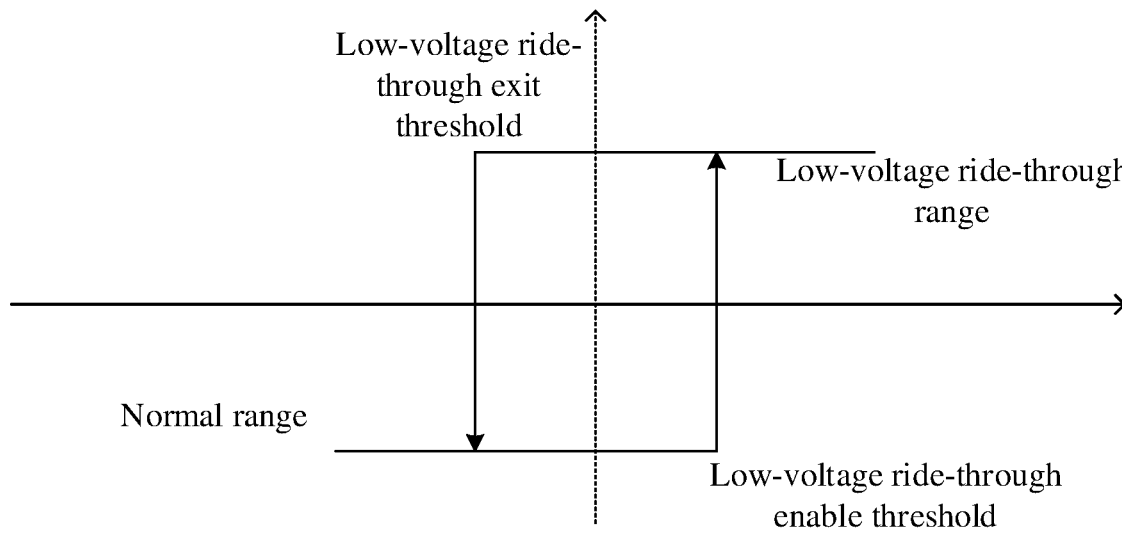
FIG. 2 shows a schematic diagram of a low-voltage ride-through hysteresis principle.

FIG. 2 shows a schematic diagram of a low-voltage ride-through hysteresis principle. Hysteresis is to avoid boundary oscillations. Without hysteresis, assuming that the low-voltage ride-through threshold is 0.9 pu, and then under a condition that the voltage is lower than 0.9 pu, the converter will enter a low-voltage ride-through state, enters the low-voltage ride-through state and starts to supplement reactive power, the voltage rises, and under a condition that the voltage is higher than 0.9 pu, the converter exits the low-voltage ride-through state. The reactive power is returned, the voltage drops below 0.9 pu, the converter enters the low-voltage ride-through state again, and this process repeats to cause boundary oscillations.

With the hysteresis controller, as shown in FIG. 2, the low-voltage ride-through enable threshold for entering the low-voltage ride-through state is set to, for example, 0.87 pu, and the low-voltage ride-through exit threshold for exiting the low-voltage ride-through state is set to, for example, 0.9 pu, so that under a condition that the voltage is lower than 0.87 pu, the converter enters the low-voltage ride-through state and starts to supplement the reactive power, and the converter will not exit the low-voltage ride-through state as the voltage does not rise above 0.9 pu. Therefore, boundary oscillations are avoided. The 0.03 pu between the 0.87 pu and the 0.9 pu is the range of the hysteresis, which is related to an impedance of the power grid and theoretically proportional to the impedance of the power grid.

Furthermore, according to an exemplary embodiment of the present disclosure, there is also provided a computer-readable storage medium having stored thereon computer programs that, when executed, implement the low-voltage ride-through detection method according to an exemplary embodiment of the present disclosure.

In an exemplary embodiment of the present disclosure, the computer-readable storage medium may carry one or more programs that, when executed, may implement the following steps: determining an adjustment value of a preset parameter of a power grid on the basis of a power grid voltage; adjusting the preset parameter of the power grid on the basis of the adjustment value; and detecting, on the basis of a power grid voltage after the preset parameter is adjusted, whether the power grid meets a low-voltage ride-through condition.

The computer-readable storage medium may be, for example but not limited to, an electronic, magnetic, optical, electromagnetic, infrared, or semiconductor system, device, or apparatus, or a combination of any of the above. More specific examples of the computer-readable storage medium may include, but are not limited to: an electrical connection having one or more wires, a portable computer magnetic disk, a hard disk, a random access memory (RAM), a read-only memory (ROM), an erasable programmable read-only memory (EPROM or Flash memory), an optical fiber, a portable compact disk read-only memory (CD-ROM), an optical storage device, a magnetic storage device, or any suitable combination of the above. In an embodiment of the present disclosure, a computer-readable storage medium may be any tangible medium that contains or stores computer programs that may be used by or in connection with an instruction execution system, device, or apparatus. Computer programs embodied on the computer-readable storage medium may be transmitted using any suitable medium including, but not limited to: wires, fiber optic cables, RF (Radio Frequency) and the like, or any suitable combination of the above. The computer readable storage medium may be embodied in any device; it may also be present separately and not fitted into the device.

Furthermore, according to an exemplary embodiment of the present disclosure, there is also provided a computer program product, wherein instructions in the computer program product are executable by a processor of a computer device to achieve the low-voltage ride-through detection method according to an exemplary embodiment of the present disclosure.

The low-voltage ride-through detection method according to an exemplary embodiment of the present disclosure has been described above in connection with FIGS. 1 and 2. Hereinafter, a low-voltage ride-through detection device according to an exemplary embodiment of the present disclosure and its units will be described with reference to FIG. 3.

Figure 3:
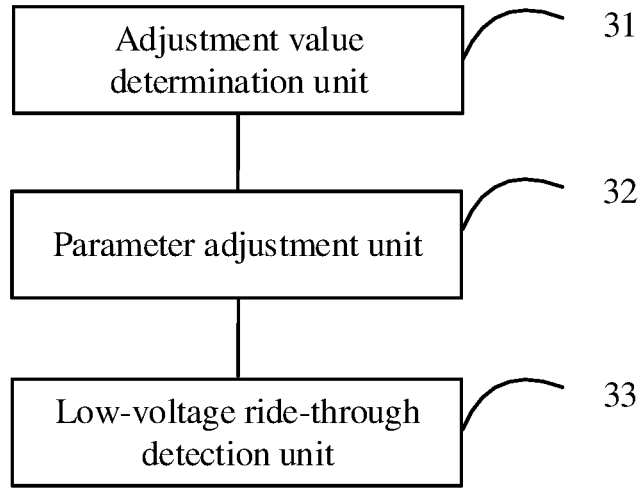
FIG. 3 shows a block diagram of a low-voltage ride-through detection device according to an exemplary embodiment of the present disclosure.

FIG. 3 shows a block diagram of the low-voltage ride-through detection device according to an exemplary embodiment of the present disclosure.

Referring to FIG. 3, the low-voltage ride-through detection device includes an adjustment value determination unit 31, a parameter adjustment unit 32, and a low-voltage ride-through detection unit 33. In an exemplary embodiment of the present disclosure, the low-voltage ride-through detection device may be provided in a converter controller of a wind turbine.

The adjustment value determination unit 31 is configured to determine an adjustment value of a preset parameter of a power grid on the basis of a power grid voltage.

In an exemplary embodiment of the present disclosure, the preset parameter may include a current, a current frequency and a power factor angle.

In an exemplary embodiment of the present disclosure, the adjustment value determination unit 31 may be configured to acquire a Q-axis component of the power grid voltage; and calculate an active current limiting amplitude output by a wind turbine on the basis of the Q-axis component of the power grid voltage.

In an exemplary embodiment of the present disclosure, the adjustment value determination unit 31 may be configured to calculate the Q-axis component of the power grid voltage by a converter phase-locked loop.

In an exemplary embodiment of the present disclosure, the adjustment value determination unit 31 may be configured to perform a filtering process on the Q-axis component of the power grid voltage; calculate the active current limiting amplitude output by the wind turbine according to the processed Q-axis component.

In an exemplary embodiment of the present disclosure, the adjustment value determination unit 31 may be configured to calculate the Q-axis component of the power grid voltage by the converter phase-locked loop, perform a filtering process on the Q-axis component of the power grid voltage, calculate the active current limiting amplitude output by the wind turbine according to the processed Q-axis component.

In an exemplary embodiment of the present disclosure, the adjustment value determination unit 31 may be configured to perform a low-pass filtering process on the active current limiting amplitude by variable rate filtering.

In an exemplary embodiment of the present disclosure, the adjustment value determination unit 31 may be configured to calculate an apparent current output by the wind turbine on the basis of the processed Q-axis component and a rated grid-connected apparent current of a wind turbine;

and calculate the active current limiting amplitude output by the wind turbine on the basis of the apparent current output by the wind turbine.

The parameter adjustment unit 32 is configured to adjust the preset parameter of the power grid on the basis of the adjustment value.

The low-voltage ride-through detection unit 33 is configured to detect, on the basis of a power grid voltage after the preset parameter of the power grid is adjusted, whether the power grid meets a low-voltage ride-through condition.

In an exemplary embodiment of the present disclosure, the low-voltage ride-through detection unit 33 may be configured to acquire a D-axis component and a Q-axis component of the power grid voltage after the preset parameter of the power grid is adjusted; calculate a vector sum of the D-axis component and the Q-axis component of the power grid voltage after the preset parameter is adjusted to obtain a positive sequence voltage amplitude of the power grid voltage after the preset parameter is adjusted; perform a low-pass filtering process on the positive sequence voltage amplitude; and detect, on the basis of a processed positive sequence voltage amplitude and a preset low-voltage ride-through threshold, whether the power grid meets a low-voltage ride-through condition.

In an exemplary embodiment of the present disclosure, the low-voltage ride-through detection unit 33 may be configured to calculate a difference between the preset low-voltage ride-through threshold and the processed positive sequence voltage amplitude; input the difference to a hysteresis controller; under a condition that the difference is greater than an entering hysteresis value of the hysteresis controller, start to count by a delay counter, and determine that the power grid meets the low-voltage ride-through condition under a condition that the count value of the delay counter reaches a target delay; and under a condition that the difference is less than an exit hysteresis value of the hysteresis controller, start to count by the delay counter, and determine that the power grid does not meet the low-voltage ride-through condition under a condition that the count value of the delay counter reaches the target delay.

In addition, according to an exemplary embodiment of the present disclosure, there is also provided a converter including the low-voltage ride-through detection device shown in FIG. 3. In addition, according to an exemplary embodiment of the present disclosure, there is also provided a wind turbine including the above converter including the low-voltage ride-through detection device shown in FIG. 3.

The low-voltage ride-through detection device according to an exemplary embodiment of the present disclosure has been described above in connection with FIG. 3. Next, a computing device according to an exemplary embodiment of the present disclosure is described in connection with FIG. 4.

Figure 4:
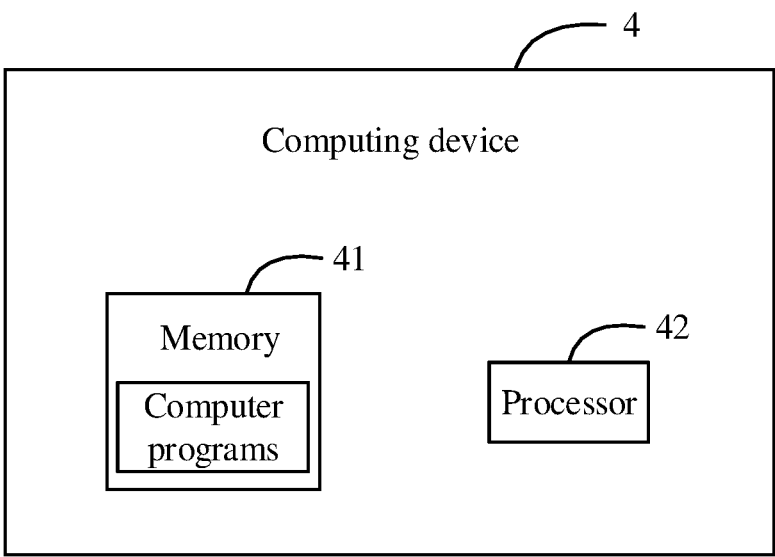
FIG. 4 shows a schematic diagram of a computing device according to an exemplary embodiment of the present disclosure.

FIG. 4 shows a schematic diagram of the computing device according to an exemplary embodiment of the present disclosure.

Referring to FIG. 4, a computing device 4 according to an exemplary embodiment of the present disclosure includes a memory 41 and a processor 42, the memory 41 has stored thereon computer programs that, when executed by the processor 42, implement the low-voltage ride-through detection method according to an exemplary embodiment of the present disclosure.

In an exemplary embodiment of the present disclosure, the computer programs, when executed by processor 42, can implement the following steps: determining an adjustment value of a preset parameter of a power grid on the basis of a power grid voltage, wherein the preset parameter includes at least one of a current, a current frequency and a power factor angle; adjusting the preset parameter of the power grid on the basis of the adjustment value; and detecting, on the basis of a power grid voltage after the preset parameter of the power grid is adjusted, whether the power grid meets a low-voltage ride-through condition.

The computing device shown in FIG. 4 is only one example and should not impose any limitations on the functionality and scope of use of the embodiments of the present disclosure.

The low-voltage ride-through detection method and device according to an exemplary embodiment of the present disclosure has been described above with reference to FIGS. 1-4. However, it should be understood that the low-voltage ride-through detection device and its units shown in FIG. 3 may each be configured as software, hardware, firmware or any combination of the above to perform a particular functionality, the computing device shown in FIG. 4 is not limited to include the components shown above, but some components may be added or deleted as needed, and the above components may also be combined.

For the low-voltage ride-through detection method and device according to the exemplary embodiments of the present disclosure, by firstly determining an adjustment value of a preset parameter of a power grid on the basis of a power grid voltage, wherein the preset parameter includes at least one of a current, a current frequency and a power factor angle, adjusting the preset parameter of the power grid on the basis of the adjustment value, and then detecting, on the basis of a power grid voltage after the preset parameter is adjusted, whether the power grid meets a low-voltage ride-through condition, a power grid fault can be accurately identified by the wind turbine in a weak grid, so as to enter a low-voltage ride-through state, thereby avoiding system instability in the process of a power grid fault ride-through in the weak grid. The low-voltage ride-through detection method and device according to an exemplary embodiment of the present disclosure greatly facilitate the development of an ultra-high voltage transmission in conjunction with a large base wind farm.

While the present disclosure has been particularly shown and described with reference to its the exemplary embodiments, those of ordinary skill in the art will understand that various changes in the form and details may be made on the present disclosure without departing from the gist and scope of the present disclosure as defined by the claims.

What is claimed is:

1. A low-voltage ride-through detection method, comprising:

determining an adjustment value of a preset parameter of a power grid on the basis of a power grid voltage, wherein the preset parameter comprises at least one of a current, a current frequency and a power factor angle;

adjusting the preset parameter of the power grid on the basis of the adjustment value; and detecting, on the basis of a power grid voltage after the preset parameter of the power grid is adjusted, whether the power grid meets a low-voltage ride-through condition.

2. The low-voltage ride-through detection method according to claim 1, wherein the step of determining an adjustment value of a preset parameter of a power grid on the basis of a power grid voltage comprises:

calculating a Q-axis component of the power grid voltage by a converter phase-locked loop;

performing a filtering process on the Q-axis component of the power grid voltage; and calculating an active current limiting amplitude output by a wind turbine according to the processed Q-axis component.

3. The low-voltage ride-through detection method according to claim 2, wherein the step of calculating an active current limiting amplitude output by a wind turbine according to the processed Q-axis component comprises:

calculating an apparent current output by the wind turbine on the basis of the processed Q-axis component and a rated grid-connected apparent current of a wind turbine; and calculating the active current limiting amplitude output by the wind turbine on the basis of the apparent current output by the wind turbine.

4. The low-voltage ride-through detection method according to claim 1, wherein the step of detecting, on the basis of a power grid voltage after the preset parameter of the power grid is adjusted, whether the power grid meets a low-voltage ride-through condition comprises:

acquiring a D-axis component and a Q-axis component of the power grid voltage after the preset parameter of the power grid is adjusted;

calculating a vector sum of the D-axis component and the Q-axis component of the power grid voltage to obtain a positive sequence voltage amplitude of the power grid voltage;

performing a low-pass filtering process on the positive sequence voltage amplitude; and detecting, on the basis of the processed positive sequence voltage amplitude and a preset low-voltage ride-through threshold, whether the power grid meets the low-voltage ride-through condition.

5. The low-voltage ride-through detection method according to claim 4, wherein the step of detecting, on the basis of the processed positive sequence voltage amplitude and a preset low-voltage ride-through threshold, whether the power grid meets the low-voltage ride-through condition comprises:

calculating a difference between the preset low-voltage ride-through threshold and the processed positive sequence voltage amplitude;

inputting the difference to a hysteresis controller;

under a condition that the difference is greater than an entering hysteresis value of the hysteresis controller, starting to count by a delay counter, and determining that the power grid meets the low-voltage ride-through condition under a condition that a count value of the delay counter reaches a target delay; and under a condition that the difference is less than an exit hysteresis value of the hysteresis controller, starting to count by the delay counter, and determining that the power grid does not meet the low-voltage ride-through condition under a condition that the count value of the delay counter reaches the target delay.

6. A low-voltage ride-through detection device, comprising:

a processor; and a memory for storing instructions executable by the processor;

wherein the processor is configured to:

determine an adjustment value of a preset parameter of a power grid on the basis of a power grid voltage, wherein the preset parameter comprises at least one of a current, a current frequency and a power factor angle;

adjust the preset parameter of the power grid on the basis of the adjustment value; and detect, on the basis of a power grid voltage after the preset parameter of the power grid is adjusted, whether the power grid meets a low-voltage ride-through condition.

7. The low-voltage ride-through detection device according to claim 6, wherein the processor is further configured to:

calculate a Q-axis component of the power grid voltage by a converter phase-locked loop;

perform a filtering process on the Q-axis component of the power grid voltage;

calculate an active current limiting amplitude output by a wind turbine according to the processed Q-axis component.

8. The low-voltage ride-through detection device according to claim 6, wherein the processor is further configured to:

acquire a D-axis component and a Q-axis component of the power grid voltage after the preset parameter of the power grid is adjusted;

calculate a vector sum of the D-axis component and the Q-axis component of the power grid voltage to obtain a positive sequence voltage amplitude of the power grid voltage;

perform a low-pass filtering process on the positive sequence voltage amplitude; and detect, on the basis of the processed positive sequence voltage amplitude and a preset low-voltage ride-through threshold, whether the power grid meets the low-voltage ride-through condition.

9. The low-voltage ride-through detection device according to claim 8, wherein the processor is further configured to:

calculate a difference between the preset low-voltage ride-through threshold and the processed positive sequence voltage amplitude;

input the difference to a hysteresis controller;

under a condition that the difference is greater than an entering hysteresis value of the hysteresis controller, start to count by a delay counter, and determine that the power grid meets the low-voltage ride-through condition under a condition that a count value of the delay counter reaches a target delay;

under a condition that the difference is less than an exit hysteresis value of the hysteresis controller, start to count by the delay counter, and determine that the power grid does not meet the low-voltage ride-through condition under a condition that the count value of the delay counter reaches the target delay.

10. The low-voltage ride-through detection device according to claim 8, wherein the low-voltage ride-through detection device is provided in a converter controller of a wind turbine.

11. A converter comprising the low-voltage ride-through detection device according to claim 6.

12. A wind turbine comprising the converter according to claim 11.

13. A non-transitory computer-readable storage medium having stored thereon computer programs that, when executed by a processor, implement the low-voltage ride-through detection method according to claim 1.

14. A computing device, comprising: at least one processor; at least one memory storing computer programs that, when executed by the at least one processor, implement the low-voltage ride-through detection method according to claim 1.

* * * * *